US006481369B1

(12) United States Patent
Takahashi et al.

(10) Patent No.: US 6,481,369 B1
(45) Date of Patent: Nov. 19, 2002

(54) THIN FILM FORMING METHOD AND APPARATUS

(75) Inventors: Yukihiro Takahashi, Tokyo (JP); Kenichi Shinde, Tokyo (JP)

(73) Assignee: Hoya Corporation, Tokyo (JP)

( * ) Notice: Subject to any disclaimer, the term of this patent is extended or adjusted under 35 U.S.C. 154(b) by 37 days.

(21) Appl. No.: 09/686,763

(22) Filed: Oct. 12, 2000

(30) Foreign Application Priority Data

Oct. 14, 1999 (JP) ............................................ 11-292496
Oct. 21, 1999 (JP) ............................................ 11-299829

(51) Int. Cl.$^7$ .......................... C23C 16/00; B05D 1/00; G01N 21/00
(52) U.S. Cl. ................................ 118/723 EB; 118/726; 118/715; 427/10; 427/566; 356/448; 356/230; 356/229
(58) Field of Search ..................... 118/723 EB, 223 VE, 118/423 CB, 723 FE, 723 FF, 726, 712, 708, 665, 695, 696, 697; 156/626.1; 427/10, 566, 8, 9; 756/448, 230, 229

(56) References Cited

U.S. PATENT DOCUMENTS

| 4,472,453 A | * | 9/1984 | Hoffman ...................... 438/478 |
| 4,915,476 A | | 4/1990 | Hall et al. |
| 5,101,111 A | * | 3/1992 | Kondo ................... 250/559.28 |
| 5,120,966 A | * | 6/1992 | Kondo ........................ 250/372 |
| 5,409,538 A | * | 4/1995 | Nakayama et al. ......... 118/688 |
| 5,425,964 A | * | 6/1995 | Southwell et al. ............. 27/10 |
| 5,450,205 A | * | 9/1995 | Sawin et al. ................. 356/632 |
| 5,747,201 A | * | 5/1998 | Nakayama et al. ........... 430/30 |
| 5,893,050 A | * | 4/1999 | Parke et al. ................... 702/97 |
| 6,236,459 B1 | * | 5/2001 | Negahdaripour et al. ... 356/496 |
| 6,278,809 B1 | * | 8/2001 | Johnson et al. ............... 385/12 |

FOREIGN PATENT DOCUMENTS

| JP | 61-147874 A | 7/1986 |
| JP | 3-50501 A | 3/1991 |
| JP | 7-090583 | 4/1995 |
| JP | 07-18055 A | 7/1995 |
| JP | 7-180055 | 7/1995 |

OTHER PUBLICATIONS

3–50501

* cited by examiner

*Primary Examiner*—Gregory Mills
*Assistant Examiner*—P. Hassanzadeh
(74) *Attorney, Agent, or Firm*—Griffin & Szipl, P.C.

(57) ABSTRACT

To provide a thin film forming method and apparatus that can automatically form thin films having constant optical properties with high reproducibility. Antireflection films are deposited on lenses 2a that are held by a coating dome 2 by vaporizing an evaporation material 4 by using an electron gun 3. The power to be applied to the electron gun 3 is controlled so that a transmission or reflection light quantity value that is measured at each time point by an optical film thickness meter 10 becomes equal or approximately equal to a standard light quantity value stored in a standard light quantity value data storing device.

12 Claims, 4 Drawing Sheets

FIG. 5

| AN2 | INITIAL POWER (mA) | EVAPORATION TIME (S) | DIFFERENCE (S) | EXTENSION AMOUNT (%) | FINAL POWER (mA) |
|---|---|---|---|---|---|
| STANDARD | 150 | 284 | 0 | 37.59 | 147.2 |
| TEST 1 | 120 | 291 | 7 | 35.60 | 145.3 |
| 2 | 130 | 295 | 11 | 37.36 | 141.8 |
| 3 | 140 | 282 | -2 | 35.66 | 146.7 |
| 4 | 150 | 282 | -2 | 36.34 | 147.2 |
| 5 | 160 | 273 | -11 | 35.26 | 148.5 |
| 6 | 170 | 271 | -13 | 35.65 | 146.0 |

FIG. 6

| AN3 | INITIAL POWER (mA) | EVAPORATION TIME (S) | DIFFERENCE (S) | EXTENSION AMOUNT (%) | FINAL POWER (mA) |
|---|---|---|---|---|---|
| STANDARD | 210 | 521 | 0 | 36.16 | 206.5 |
| TEST 1 | 180 | 528 | 7 | 36.14 | 204.5 |
| 2 | 190 | 530 | 9 | 35.98 | 205.3 |
| 3 | 200 | 519 | -3 | 35.52 | 205.3 |
| 4 | 210 | 519 | -3 | 35.46 | 206.3 |
| 5 | 220 | 525 | 4 | 35.88 | 207.0 |
| 6 | 230 | 523 | 2 | 36.90 | 206.5 |

THIN FILM FORMING METHOD AND APPARATUS

FIELD OF INVENTION

The present invention relates to a method and apparatus for forming a thin film on the surface of a plastic member, a glass member, or the like. In particular, the invention relates to a method and apparatus for forming thin films, having constant optical properties with high reproducibility, that are suitable for use in, for example, forming an antireflection film on a lens for eyeglasses.

BACKGROUND OF THE INVENTION

In the formation of thin films on the surfaces of plastic or glass members, it is desirable to form thin films having the same quality fully automatically with high reproducibility. As an attempt to satisfy the above requirement, Japanese Unexamined Patent Publication No. Hei. 3-50501 discloses a method and apparatus in which the value of current supplied to an electron gun is monitored, the actual current data is compared with preset reference data, and, when a deviation occurs between the actual and reference data, the value of current to be supplied to the electron gun is corrected and controlled in accordance with the deviation.

Furthermore, Japanese Unexamined Patent Publication No. Sho. 61-147874 discloses a method and apparatus in which the thickness of an evaporated film is detected by a quartz oscillator method and the value of current to be supplied to an electron gun is corrected and controlled. In the quartz oscillator method, a film thickness is calculated by sticking a thin film to a quartz oscillator and detecting a variation of the inherent frequency that is proportional to a variation of its mass. Still further, Japanese Unexamined Patent Publication No. Hei. 7-180055 discloses a control method in which the time necessary for film formation is managed so as to be equal to a target time necessary for film formation by correcting a current value of an evaporation source by using a quartz film thickness meter and the evaporation rate is thereby made constant.

However, in the methods disclosed in Japanese Patent Publication Nos. Hei. 3-50501 and Hei. 7-180055, it is difficult to cope with a phenomenon that the degree of evaporation of an evaporating substance varies as the film forming apparatus is used repeatedly. In particular, for thin films for optical products such as an antireflection film for eyeglass lenses (in optical products, tolerances of errors relating to the quality of a thin film are small), these methods are not suitable for forming thin films having the same quality fully automatically with high reproducibility. This is because, in the methods disclosed in Japanese Patent Publication Nos. Hei. 3-50501 and Hei. 7-180055, even if the current value of the electron gun is controlled as correctly as possible, a thin film formed may be much different from an intended film when any of a number of parameters, e.g., the state of the filament of the electron gun, the substrate temperature, the vacuum conditions, etc., differ from a set condition.

The methods disclosed in Japanese Patent Publication Nos. Sho. 61-147874 and Hei. 7-180055 in which the value of current supplied to the electron gun is corrected and controlled by using a quartz oscillator have the following problems. In the quartz oscillator method, the measured physical quantity is a variation of frequency that is caused by a variation of the mass of film that is stuck to the quartz oscillator. Therefore, the quantity that is measured through the frequency is the mass of a film and not the optical film thickness. The optical film thickness is determined by the product of the geometrical thickness and the refractive index of the film and is not uniquely determined by the mass.

As described above, the quartz oscillator method measures the mass that is not in a unique relationship with the optical film thickness. Therefore, to determine an optical film thickness from a mass value, it is necessary to make a calculation by determining a proper conversion coefficient according to empirical rules. However, since such a conversion coefficient depends on various conditions such as film formation conditions, a difference in such conditions directly leads to a conversion error. Therefore, not only is it difficult to determine a proper conversion coefficient but also, in principle, there are no large differences between the methods concerned and the above methods in which the current of the electron gun is controlled.

In addition, the methods concerned are very easily affected by electrical noise because a quartz oscillator is disposed in a film forming chamber, the same film as an intended film is formed thereon, and the frequency of the quartz oscillator is measured electrically as a faint electrical signal. However, as many noise sources exist in the film forming chamber, it is no exaggeration to say that the chamber is filled with electrical noise sources. Therefore, there is another problem that, in reality, it is not necessarily easy to detect a signal by eliminating these noises.

SUMMARY OF THE INVENTION

The present invention has been made to solve the above problems, and an object of the invention is to provide a thin film forming method and apparatus that can automatically form thin films having constant optical properties with high reproducibility by controlling, during a film forming process, the amount of film forming material supplied (such as by vaporization) so that a measured value that uniquely depends on the instantaneously varying optical film thickness becomes or approaches a standard value.

As a means for solving the above problems, the inventors have provided a thin film forming method for performing film formation by vaporizing a film forming material and depositing a thin film of the material on a surface of an object, comprising the steps of:

measuring a thickness of the thin film deposited with an optical film thickness meter that measures the thickness of the thin film by measuring, a quantity of light transmission or reflection obtained when a prescribed light is applied to the object on which the thin film is formed; and controlling an amount of the film forming material vaporized so that a value of the quantity of light transmission or reflection measured at each time point by the optical film thickness meter becomes equal or approximately equal to a standard light quantity value.

The inventors have also provided a thin film forming apparatus having film forming means for causing a film forming material to fly in a film forming chamber and depositing it on a surface of a subject of film formation, comprising:

an optical film thickness meter for measuring a thickness of a thin film by obtaining a quantity of light transmission or reflection when a prescribed light is applied to an object on which the thin film is formed;

storing means for storing (a) standard values of the quantity of light transmission or reflection at given points in time in a film forming process measured by the optical film thickness meter when a prescribed light is applied to an object on which a film is formed, or (b) standard values of the variation of the quantity of light transmission or reflection at given points in time in a film forming process measured by the optical film thickness meter when a prescribed light is applied to an object on which a film is formed; and control means for controlling an amount of a film forming material that is vaporized by the film forming means so that a quantity of light transmission or reflection measured at a given time point, or a variations in the quantity of light transmission or reflection at a given time point becomes equal to or approximately equal to standard values at corresponding points in time.

As a means for solving the above problems, the inventors have also provided a thin film forming method for forming a thin film by vaporizing a film forming material with an electron gun and depositing the material on a surface of an object, comprising the steps of:

measuring a thickness of the thin film with an optical film thickness meter that measures a thickness of the thin film by measuring a quantity of light transmission or reflection that depends on the thickness of the film when a prescribed light is applied to the object on which the thin film is formed;

measuring, at intervals of time, light quantity transmission or reflection values from a start to an end of a standard film formation with the optical film thickness meter, and thereby generating, standard light quantity value data of light quantity values versus film formation time as measured from the start of the film formation; and measuring actual light quantity values of transmission or reflection from a start to an end of a film formation, and controlling power supplied to the electron gun so that the light quantity value becomes equal or approximately equal to a standard light quantity value at a corresponding time point of the standard light quantity value data.

The inventors have also provided a thin film forming apparatus which performs film formation by causing a film forming material to vaporize by using an electron gun and depositing it on a surface of a subject of film formation, comprising:

an optical film thickness enter for measuring a thickness of a thin film by utilizing a fact that a transmission or reflection light quantity that is obtained when a prescribed light is applied to a subject of film formation on which the thin film is formed depends on the thickness of the thin film;

storing means for storing standard light quantity value data as pairs of a light quantity value and a film formation time as measured from a start of film formation that are generated by performing the film formation and measuring at intervals transmission or reflection light quantity values from the start to an end of the film formation with the optical film thickness meter; and control means for comparing, during film formation, a light quantity value that is measured at each time point by the optical film thickness meter with a standard light quantity value at a corresponding time point of the standard light quantity value data stored in the storing means, and for controlling power to be applied to the electron gun so that the actual and standard light quantity values become equal or approximately equal.

Further objects features and advantages of the present invention will become apparent from the Detailed Description of Preferred Embodiments when considered together with the attached figures of drawing.

BRIEF DESCRIPTION OF THE DRAWINGS

FIG. 5. is a table showing an example according to the present invention in which film formation was performed by using an evaporation material AN2.

FIG. 6. is a table showing an example in which film formation was performed by using an evaporation material AN3.

DETAILED DESCRIPTION OF THE PREFERRED EMBODIMENT

Figure 1:
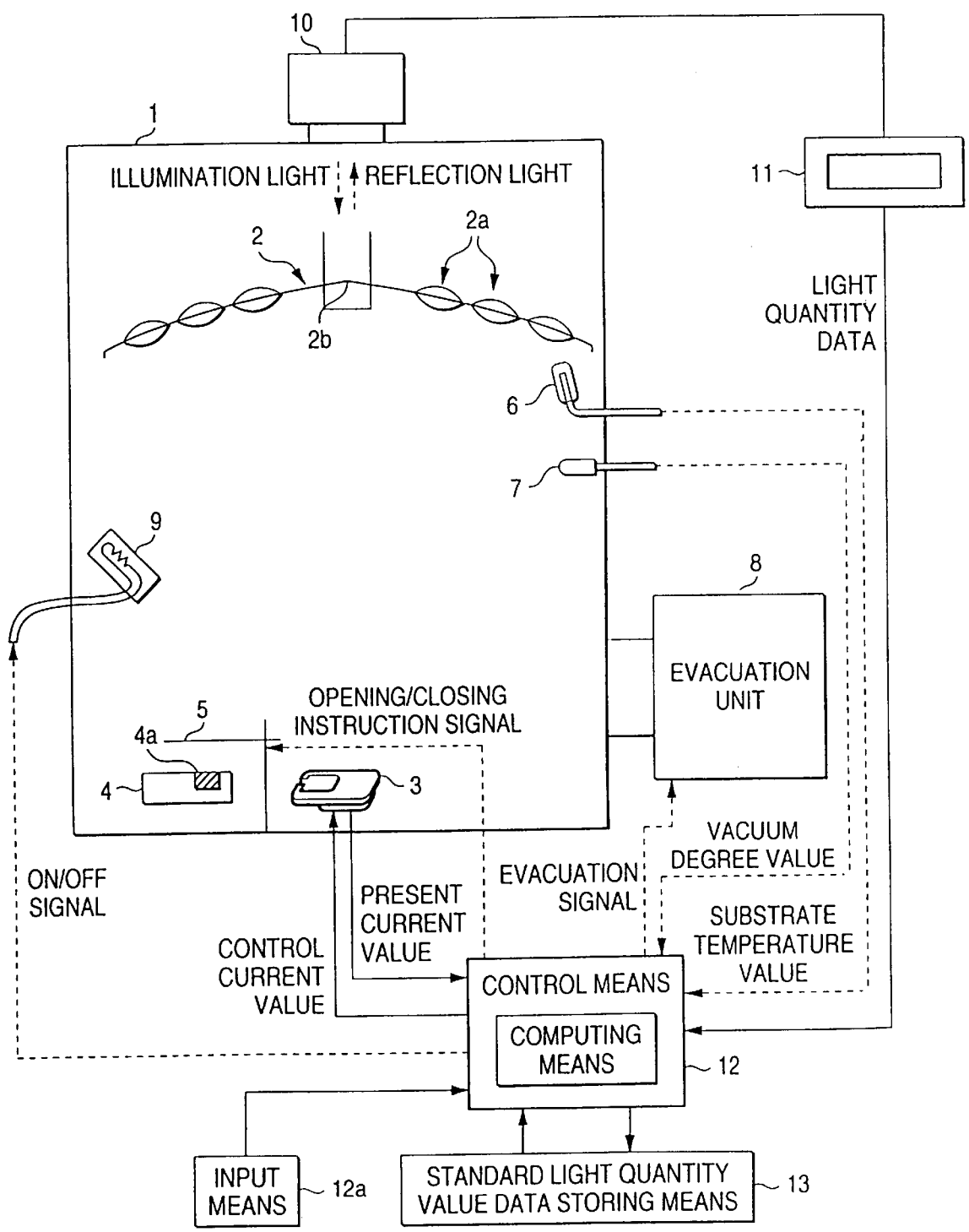
FIG. 1. shows the configuration of a thin film forming apparatus according to an embodiment of the present invention.

FIG. 1 shows the configuration of a thin film forming apparatus according to an embodiment of the present invention. The embodiment will be hereinafter described with reference to FIG. 1. Note that in this embodiment, the invention is applied to a case of forming antireflection films, i.e., thin films, on plastic lenses for eyeglasses.

As shown in FIG. 1, inside a film forming vacuum chamber 1, a coating dome 2 is disposed at a top position in chamber 1, and an electron gun 3, a crucible 4, a shutter 5, etc., are disposed at bottom positions in chamber 1. A substrate thermometer 6 for measuring the temperature of lenses 2a held by the coating dome 2 is disposed in the vicinity of the coating dome 2. The vacuum chamber 1 is provided with a vacuum gauge 7 for measuring the degree of vacuum in the vacuum chamber 1, an evacuation unit 8 for evacuating the vacuum chamber 1, and a halogen heater 9 for heating the lenses 2a held by the coating dome 2.

Furthermore, an optical film thickness meter 10 is disposed outside, that is, on top of, the vacuum chamber 1. The optical film thickness meter 10 is connected to a controller 12 via a film thickness monitor 11. A standard light quantity value data storing means 13 and an input means 12a are connected to the controller 12. Furthermore, the electron gun 3, the shutter 5, the substrate thermometer 6, the vacuum gauge 7, the evacuation unit 8, and the halogen heater 9 are electrically connected to the controller 12. The controller 12 performs various kinds of control while exchanging information with these devices.

That is, the controller 12 controls the evacuation unit 8 based on information of the vacuum gauge 7 and thereby sets the degree of vacuum in the vacuum chamber 1 at a prescribed value.

The controller 12 also controls the halogen heater 9 based on information from the substrate thermometer 6 and thereby sets the temperature of the lenses 2a at a prescribed value.

The controller 12 controls power (current and/or voltage) supplied to the electron gun 3 so that the actual light quantity at each time point, which varies depending on the optical film thickness at each time point of a thin film formed on a monitoring glass plate 2b, measured by the optical film thickness meter 10 becomes equal to a corresponding standard value stored in the standard light quantity value data storing means.

The coating dome 2 is a holding means for holding the lenses 2a so that antireflection films or like thin films are deposited (by vaporization or evaporation) on the respective lenses 2a. The coating dome 2 has a circular shape so that deposition can be performed on a plurality of lenses 2a at the same time. The coating dome has a curvature such that antireflection films having the same quality or similar quality at least are formed on all lenses.

The electron gun 3 serves to vaporize an evaporating substance (material) 4a that is accommodated in the crucible 4, by heating substance 4a to its melting temperature, and thereby vaporize and deposit substance 4a on the lenses 2a and monitoring glass plate 2b to form thin films thereon.

The crucible 4 is a known container that is used for holding the evaporation substance 4a therein. To prevent sudden boiling of the evaporating substance when it is heated with the electron gun 3, the crucible 4 is cooled or preferably made of a substance having low thermal conductivity.

Shutter 5 is opened when evaporation is started and is closed when evaporation is finished. Shutter 5 serves to facilitate control of the thin films formed.

Halogen heater 9 is a heating means for heating the lenses 2a to set their temperature at a proper value to make proper the properties such as adhesiveness of thin films that are deposited on the lenses 2a.

The optical film thickness meter 10 utilizes a phenomenon that, when light is applied to a transparent substrate with a transparent thin film formed on its surface, light reflected by the surface of the thin film and light reflected by the surface of the transparent substrate interfere with each other due to a phase difference between them. That is, the phase difference and hence the state of interference vary with the optical film thickness of the thin film, whereby the quantity of light reflection (also referred to herein as the light quantity of reflection) varies depending on the optical film thickness. When the reflected light varies, the transmitted light (as referred to as light quantity of transmission) also varies. Therefore, a similar operation can be performed by measuring the quantity of the transmitted light (light quantity of transmission). The following description will be directed to the case of using reflected light.

Figure 2:
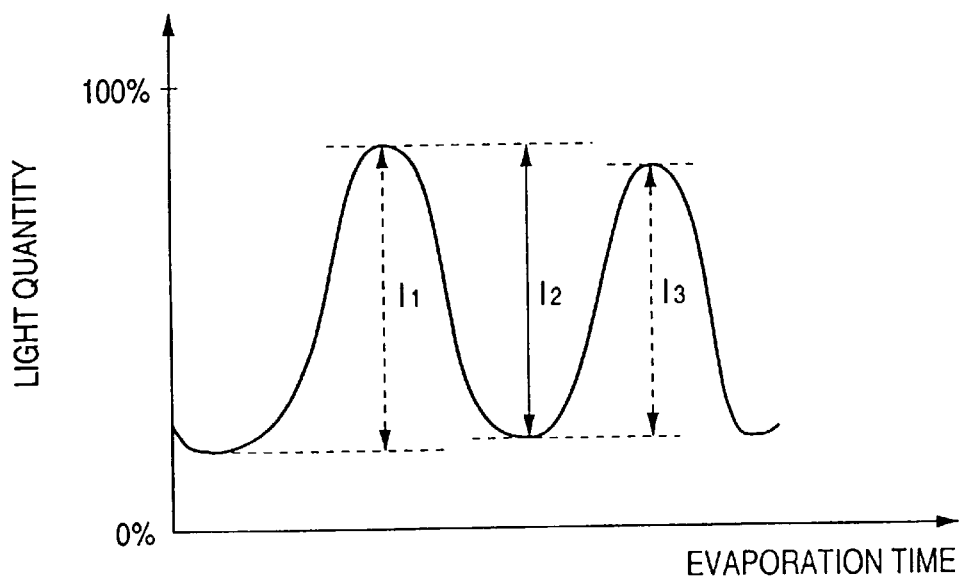
FIG. 2. shows how the reflection light quantity varies as a thin film is formed on a glass surface through evaporation.

FIG. 2 shows how the quantity of reflected light varies as a thin film is formed on a glass surface through evaporation. In the figure, the vertical axis represents the light quantity (relative value, in units of %) and the horizontal axis represents the evaporation (vapor deposition) time. Where the film to be deposited is thick, the light quantity repeatedly increases and decreases in a periodic manner as the optical film thickness increases. By using a variation of the light quantity that uniquely corresponds to the optical film thickness, the optical film thickness can be uniquely measured and/or controlled. In this case, the difference between the maximum value and the minimum value in each cycle is called an extension amount. In general, extension amounts $l_1, l_2, l_3, \ldots$ do not always coincide with each other.

Figure 3:
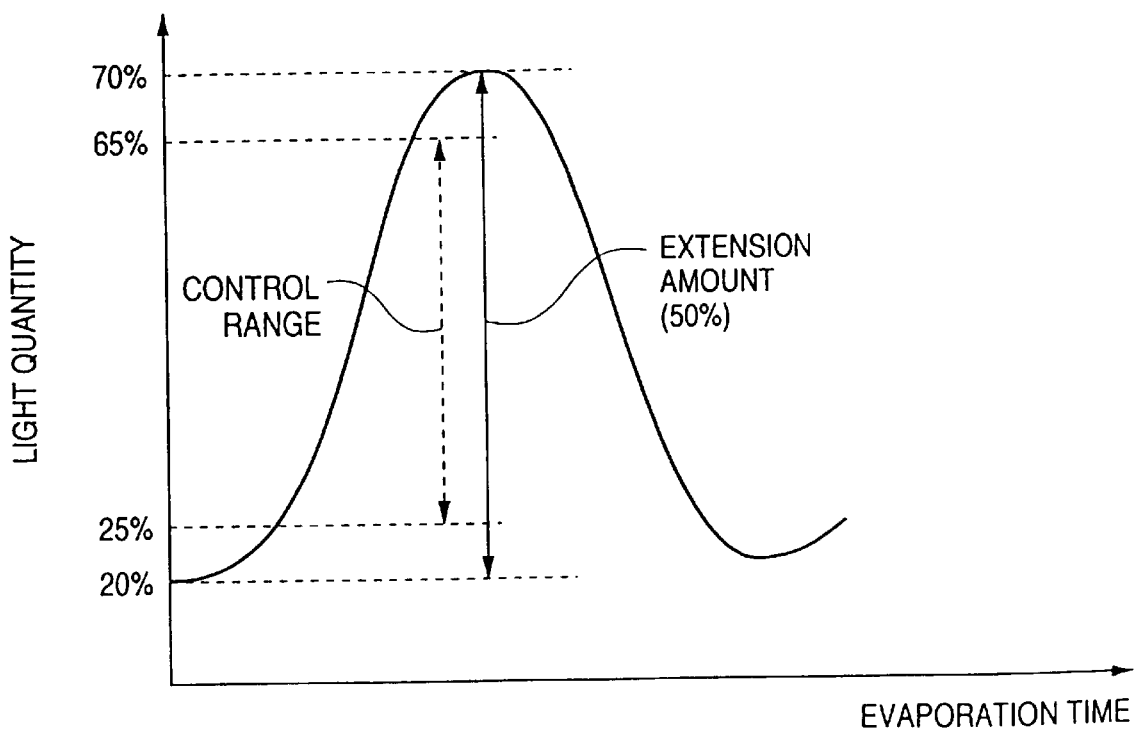
FIG. 3. shows a region of an extension amount that is used for control.

Considering the fact that extension amounts $l_1, l_2, l_3, \ldots$ do not always coincide with each other, it is possible to use part of the overall extension amount rather than the overall extension amount. FIG. 3 shows a region of an extension amount that is used for control. As shown in FIG. 3, where the minimum value and the maximum value of the light quantity value are 20% and 70%, respectively, and hence the extension amount is 50%, control is performed without using top and bottom 5% regions, that is, by using a region where the light quantity value is between about 25–65%.

In this embodiment, the optical film thickness meter 10 applies light to the monitoring glass plate 2b that is held at the center of the coating dome 2 and measures light that is reflected from the monitoring glass plate 2b. Since a thin film formed on the monitoring glass plate 2b is considered to be the same or similar as thin films formed on the respective lenses 2a, the same information as would be obtained from the thin films formed on the respective lenses 2a can be obtained from the monitoring glass plate 2b in this manner.

A thin film forming method according to the embodiment will be hereinafter described in a more specific manner. First, lenses 2a and a monitoring glass plate 2b are set on the coating dome 2 and an evaporating material 4a is set in the crucible 4. Thereafter, the degree of vacuum in the vacuum chamber 1 is set at a prescribed value and the temperature of the lenses 2a are set at a prescribed value by using the halogen heater 9. Then, evaporation is started by starting control of power supplied to the electron gun 3.

Formation of an evaporation film is started after the opening of shutter 5. Therefore, a time point when the shutter is opened is employed as time 0 and the time that elapses thereafter is represented by t (sec). In general, after the shutter 5 is opened, the light quantity measured by the optical film thickness meter 10 starts to vary. However, in reality, sometimes the light quantity starts to vary after a delay. In this case, control can be started by forcibly supplying prescribed power to the electron gun 3 after a a prescribed time has elapsed.

First, standard film formation is performed by setting various conditions such as the electron gun power (current value) to conditions under which the best film formation could be performed. In short, this standard film formation is film formation in which desired antireflection films are formed. Therefore, where various conditions of the apparatus are proper, there may occur a case that the only control necessary is to make the power supplied to the electron gun constant. In other cases, the standard film formation is such that film formation is performed while various conditions are controlled according to the experience and intuition of a skilled person.

In standard film formation, the light quantity 1(%) of the optical film thickness meter with respect to the time t (sec) in the film formation process is recorded at sampling intervals Tsmp, whereby light quantity value data in the form of data pairs of light quantity versus time are generated. The light quantity value data are stored in the standard light quantity value storing means 13 as standard light quantity value data.

From the next film formation onward, while a software-based control is performed by a computer, the standard light quantity value data that are stored in the standard light quantity value data storing means 13 are called up and compared with actual, measured light quantity values and the current value of the electron gun 3 is adjusted so that the two light quantity values (actual and standard) coincide with each other.

The controller 12, being a control means, that controls power (current and/or voltage supplied to the electron gun 3 also includes (a) a means for calculating a measurement light quantity variation ($\Delta l = l_i - l_{i-1}$), after a lapse of an arbitrary time ($\Delta t = t_i - t_{i-1}$) determined by the controller, (b) a means for searching the standard light quantity value data storing means for a light quantity value (ls) that is the equal or close to a light quantity value ($I_{i-1}$) measured by the optical film thickness meter at an arbitrary time point ($t_{i-1}$)

and a corresponding time point (ts), wherein when there is not a light quantity value (ls) that is equal to or close to a light quantity value ($l_{i-1}$) an approximate light quantity value is calculated, (c) a means for determining a standard light quantity value (ls') after a lapse of the arbitrary time ($\Delta t = t_i - t_{i-1}$), and for determining a standard light quantity variation ($\Delta ls_i = ls' - ls$) between the standard light quantity value (ls) and the standard light quantity value (ls'); and (d) a means for controlling power to be applied to the electron gun by using the measurement light quantity variation ($\Delta l = l_i - l_{i-1}$) determined by the measurement light quantity variation calculating means and the standard light quantity variation ($\Delta ls_i = ls' - ls$) determined by the standard light quantity variation calculating means.

The control of the current value of the electron gun is performed in the following manner. First, a light quantity ((actual measurement value)=(actual light quantity)) at a time point $t_{i-1}$ (real time point) as measured from the opening of the shutter is represented by $l_{i-1}$ and the standard data are searched for a standard light quantity ls ($=l_{i-1}$) that is equal to $l_{i-1}$, where i means an ith control operation. If there is no equal value, an approximate value is calculated. Then, a time point ts (standard time point) corresponding to the light quantity ls is calculated based on the standard data.

Thereafter, a light quantity (actual measurement value= actual light quantity) corresponding to a time point ti that succeeds the real time point $t_{i-1}$ by a control interval $\Delta t$ (sec) is represented by li. Further, a standard light quantity ls' corresponding to a standard time point ts' ($=ts+\Delta t$) is obtained from the standard data.

Now, $\Delta li$ (also known as "measurement light quantity variation") and $\Delta ls_i$ (also known as "standard light quantity variation") are defined by $$\Delta li \equiv li - l_{i-1}$$

$$\Delta ls_i \equiv ls' - ls.$$

Ri is defined by $$Ri \equiv 1 - \Delta li/\Delta ls_i$$

or $$Ri \equiv (ls' - li)/(ls' - ls).$$

Figure 4:
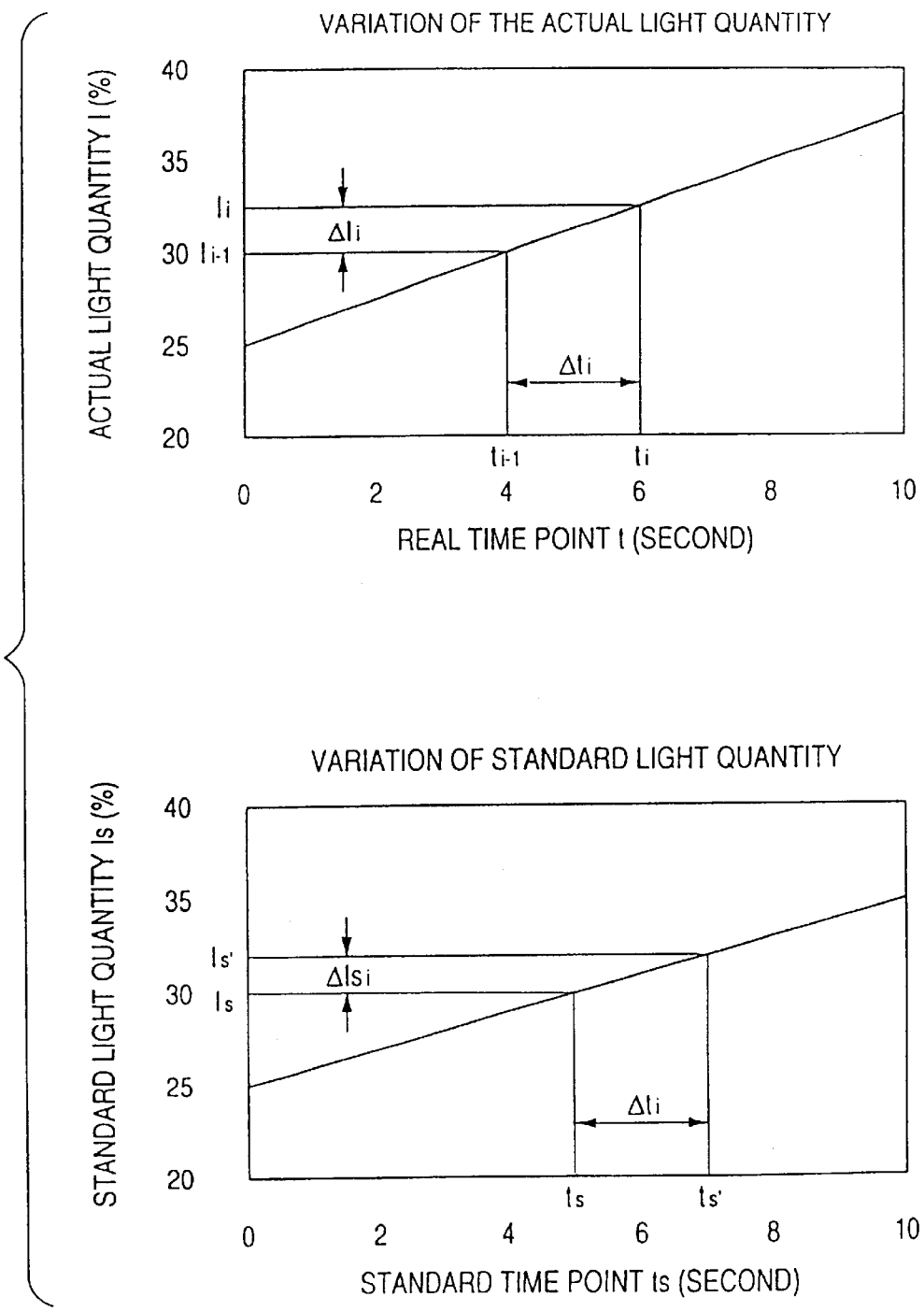
FIG. 4. shows a variation of the actual light quantity and a variation of the standard light quantity versus time.

FIG. 4 shows the variation of the actual light quantity and the standard light quantity versus time.

Further, the following conversion is performed on Ri:

$$Qi \equiv kRi|Ri|$$

where k is an arbitrary constant. The electron gun power value Pi is determined at intervals of time by performing a PID (proportion, integration, and differentiation) control for Qi. A PID control equation for determining the electron power value Pi is as follows:

$$Pi = P_{i-1} + Kp \cdot Qi + Ki \cdot \Sigma Qi + Kd \cdot detQi$$

In the above equation, Kp, Ki, and Kd are arbitrary constants and $$\Sigma Qi = \int_{ti-1}^{ti} Q(t)dt \qquad \text{Equation 1}$$

$$detQi = Qi - Q_{i-1}$$

The above control is performed every control interval $\Delta ti$ (sec).

However, the above control interval $\Delta ti$ (sec) is varied in accordance with the coincidence factor (Ri). In general, the control interval $\Delta ti$ is set larger when the decree of coincidence is higher (Ri is closer to 0) It is possible to determine the electron gun power value Pi from time to time by performing a PID (proportion, integration, and differentiation) control for Ri. Where $\Delta lsi$ and $\Delta li$ are close to each other, it is also possible to set a proper electron gun current value by converting Ri according to the following equation:

$$Qi = kRi|Ri|$$

The control of the current value of the electron gun is also performed in the following alternative manner. First, a light quantity value (actual measurement value) at time ti as measured from the opening of the shutter is represented by li (%) and a standard light quantity value (standard light quantity value determined from the standard data) at time ti is represented by $ls_i$ (%), where i means an ith control operation.

Now, Ri is defined by $$Ri \equiv ls_i - li.$$

The electron gun power value Pi is determined at intervals by performing a PID (proportion, integration, and differentiation) control for Ri. A PID control equation for determining the electron power value Pi is as follows:

$$P_i \equiv P_{i-1} + K_p \cdot R_i + K_i \cdot \sum_i R_i + K_d \cdot detR_i \qquad \text{Equation 2}$$

where Kp, Ki, and Kd are arbitrary constants and $$\sum_i R_i \equiv R_1 + R_2 + R_3 + \cdots R_i \qquad \text{Equation 3}$$

$$detR_i \equiv R_i - R_{i-1}.$$

The electron gun power (current value) is adjusted by performing the above control every control interval $\Delta t$ (sec).

Thus, the electron gun controlling means of controller 12 performs conversion operations of $Ri = 1 - (\Delta l_i / \Delta ls_i)$ and $Qi = kRi|Ri|$ (k: arbitrary constant), and controls power supplied to the electron gun by PID (proportion, integration, and differentiation) control so as to minimize $|Qi|$; wherein $\Delta li \equiv li - l_{i-1}$; wherein $\Delta ls_i \equiv ls'' - ls$; wherein li is an actual light quantity at a time point of ti; wherein $l_{i-1}$ is an actual light quantity at a time point of $t_{i-1}$; wherein ls is a standard light quantity at a time point of ts; wherein ls' is a standard light quantity at a time point ts'; and wherein ts' is defined as: ts'$\equiv$ts+$\Delta t$.

Examples are described below in which single-layer films ($\lambda/2$ ($\lambda=500$ nm) layer) were formed by using the above method and apparatus according to the present invention. FIG. 5 shows an example in which film formation was performed by using an evaporation material AN2, and FIG. 6 shows an example in which film formation was performed by using an evaporation material AN3.

The evaporation material AN2 is made of $ZrO_2$ and the evaporation material AN3 is a mixture of $Ta_2O_5$, $ZrO_2$, $Y_2O_3$, and $Al_2O_3$.

The other conditions are as follows:

Lens substrate: Thiourethane plastic lens

Lens heating temperature: About 70° C.

Vacuum condition: 3.6–5.0×10$^{-3}$ Pa

Optical film thickness meter: OPM-V1 (manufactured by Synchron Corp.)

Evaporation apparatus: BMC-1050HP (manufactured by Synchron Corp.)

The results of FIGS. 5 and 6 show that, in the case of AN2, differences in evaporation time are at most about 10 sec in spite of the fact that electron gun initial power values (evaporation start power values) are different from each other. Final power values are approximately constant (about 147 mA). Also, extension amounts are almost uniform.

In the case of AN3, as in the case of AN2, differences in evaporation time are less than 10 sec in spite of the fact that electron gun initial power values (evaporation start power values) are different from each other. The accuracy is higher than in the case of AN2, which may be due to longer evaporation times. Final power values coincide to a very high degree. Measured extension amounts and standard extension amounts are almost uniform and hence it can be said that the thin films have the same characteristics.

That is, the above results show that since in the invention the current value of the electron gun is controlled with attention paid to the light quantity that is measured by the optical film thickness meter, even if another condition (the substrate temperature, the degree of vacuum, or the like) is different from a set value antireflection films having only a small variation in the antireflection characteristic can be formed without requiring human intervention. The light quantity that is measured by the optical film thickness meter is a quantity that uniquely depends on the optical film thickness of a thin film. Therefore, by performing control so that this light quantity value coincides with the standard light quantity value, even if a condition of the apparatus or some other factor varies, thin films are formed so as to satisfy a condition that optical film thickness values at each time point of film formation are the same and finally thin films having approximately the same optical performance can be obtained reliably.

As described above in detail, in the invention, a thin film forming method in which film formation is performed by causing a film forming material to vaporize and be deposited on the surface of an object is characterized by using an optical film thickness meter that measures a thickness of a thin film by the principle that the quantity of light transmission or reflection obtained when a prescribed light is applied to an object on which the thin film is formed depends on the thickness of the thin film, and controlling, in a film forming process, an amount of a film forming material vaporized so that a the light quantity values of transmission or reflection measured at a given point in time by the optical film thickness meter becomes equal or approximately equal to a standard light quantity value. Therefore, a thin film forming method and apparatus capable of automatically forming thin films having constant optical properties with high reproducibility are obtained.

It is readily understood by one of ordinary skill in the art that additions, deletions, substitutions, modifications and improvements can be made while remaining within the scope and spirit of the invention as defined by the appended claims.

DESCRIPTION OF SYMBOLS

1: Vacuum chamber
2: Coating dome
3: Electron gun
4: Crucible
5: Shutter
6: Substrate thermometer
7: Vacuum gauge
8: Evacuation unit
9: halogen heater
10: Optical film thickness meter
11: Film thickness monitor
12: Control means
13: Standard light quantity value data storing means.

What is claimed is:

1. An apparatus for forming thin film on an object, comprising:

an optical film thickness meter that measures a thickness of a thin film by measuring a light quantity of transmission or reflection obtained when a prescribed light is applied to an object on which the thin film is formed, wherein the light quantity depends on the thickness of the thin film;

a means for storing standard light quantity values for transmission or reflection versus time as measured by the optical film thickness meter when the prescribed light is applied to the object when the object is a standard object, wherein the means for storing standard light quantity values also stores standard light quantity value variations for transmission or reflection versus time determined from the standard light quantity values;

a means for vaporizing a thin film forming substance and thereby depositing a thin film on the object; and a means for controlling an amount of the film forming substance vaporized by the means for vaporizing, wherein actual light quantity values of transmission or reflection are measured versus time by the optical film thickness meter when the prescribed light is applied to the object, or actual light quantity value variations of transmission or reflection versus time are determined from the actual light quantity values, and wherein the actual light quantity value measured at a given point in time by the optical film thickness meter becomes equal to or approximately equal to the respective standard light quantity value stored in the means for storing.

2. The thin film forming apparatus of claim 1, wherein said means for vaporizing a thin film forming substance comprises an electron gun for vaporizing the film forming substance.

3. The thin film forming apparatus of claim 2, wherein said storing means stores standard reflection light quantity value data ($ls_1, ls_2, ls_3, \ldots, ls_m$) at respective time points ($ts_1, ts_2, ts_3, \ldots, ts_m$) for a standard thin film; wherein said optical film thickness meter measures actual reflection light quantity values ($l_1, l_2, l_3, \ldots, l_n$) of a thin film at respective time points as a next film is formed at respective unit times ($t_1, t_2, t_3, \ldots, t_n$); and wherein said control means comprises:

a means for calculating a light quantity variation ($\Delta l = l_i - l_{i-1}$), after a lapse of an arbitrary time ($\Delta t = t_i - t_{i-1}$) determined by said control means;

a means for searching the standard light quantity value data storing means for a light quantity value (ls) that is the equal or close to a light quantity value ($l_{i-1}$) measured by the optical film thickness meter at an arbitrary time point ($t_{i-1}$) and a corresponding time point (ts), wherein when there is no light quantity value (ls) that is equal to or close to the light quantity value ($l_{i-1}$) an approximate value for the light quantity value (ls) is calculated;

a means for determining a standard light quantity value (ls') after a lapse of the arbitrary time ($\Delta t = t_i - t_{i-1}$), and for determining a standard light quantity variation ($\Delta ls_i = ls' - ls$) between the standard light quantity value (ls) and the standard light quantity value (ls'); and a means for controlling power to be applied to the electron gun by using the measurement light quantity variation ($\Delta l=l_i-l_{i-1}$) determined by the measurement light quantity variation calculating means and the standard light quantity variation ($\Delta ls_i=ls'-ls$) determined by the standard light quantity variation calculating means.

4. A thin film forming apparatus of claim 3, wherein said electron gun power controlling means performs conversion operations of $Ri\equiv1-(\Delta l_i/\Delta ls_i)$ and $Qi\equiv kRi|Ri|$ (k: arbitrary constant), and controls power supplied to the electron gun by PID (proportion, integration, and differentiation) control so as to minimize $|Qi|$;

wherein $\Delta li \equiv li-l_{i-1}$;

wherein $\Delta ls_i \equiv ls'-ls$;

wherein li is an actual light quantity at a time point of ti;

wherein $l_{i-1}$ is an actual light quantity at a time point of $t_{i-1}$;

wherein ls is a standard light quantity at a time point of ts;

wherein ls' is a standard light quantity at a time point ts';

wherein ts' is defined as: $ts'=ts+\Delta t$, wherein $\Delta t=t_i-t_{i-1}$.

5. The thin film forming apparatus of claim 1, wherein said storing means stores standard reflection light quantity value data ($ls_1, ls_2, ls_3, \ldots, ls_m$) at respective time points ($ts_1, ts_2, ts_3, \ldots, ts_m$) for a standard thin film; wherein said optical film thickness meter measures actual reflection light quantity values ($l_1, l_2, l_3, \ldots, l_n$) of a thin film at respective time points as a next film is formed at respective unit times ($t_1, t_2, t_3, \ldots, t_n$); and wherein said control means comprises:

a means for calculating a light quantity variation ($\Delta l=l_i-l_{i-1}$), after a lapse of an arbitrary time ($\Delta t=t_i-t_{i-1}$) determined by said control means;

a means for searching the standard light quantity value data storing means for a light quantity value (ls) that is the equal or close to a light quantity value ($l_{i-1}$) measured by the optical film thickness meter at an arbitrary time point ($t_{i-1}$) and a corresponding time point (ts), wherein when there is no light quantity value (ls) that is equal to or close to the light quantity value ($l_{i-1}$) an approximate value for the light quantity value (ls) is calculated;

a means for determining a standard light quantity value (ls') after a lapse of the arbitrary time ($\Delta t=t_i-t_{i-1}$), and for determining a standard light quantity variation ($\Delta ls_i=ls'-ls$) between the standard light quantity value (ls) and the standard light quantity value (ls'); and a means for controlling power to be applied to an electron gun by using the measurement light quantity variation ($\Delta l=l_i-l_{-1}$) determined by the measurement light quantity variation calculating means and the standard light quantity variation ($\Delta ls_i=ls'-ls$) determined by the standard light quantity variation calculating means.

6. A thin film forming apparatus of claim 5, wherein said electron gun power controlling means performs conversion operations of $Ri\equiv1-(\Delta l_i/\Delta ls_i)$ and $Qi\equiv kRi|Ri|$ (k: arbitrary constant), and controls power supplied to the electron gun by PID (proportion, integration, and differentiation) control so as to minimize $|Qi|$;

wherein $\Delta li \equiv li-l_{i-1}$;

wherein $\Delta ls_i \equiv ls'-ls$;

wherein li is an actual light quantity at a time point of ti;

wherein $l_{i-1}$ is an actual light quantity at a time point of $t_{i-1}$;

wherein ls is a standard light quantity at a time point of ts;

wherein ls' is a standard light quantity at a time point ts';

wherein ts' is defined as: $ts'=ts+\Delta t$, wherein $\Delta t=t_i-t_{i-1}$.

7. A thin film forming apparatus, comprising:

a vacuum chamber;

a coating dome disposed at a top position inside of said vacuum chamber for holding objects on which a film is to be formed;

an electron gun, having a power supply, and being disposed at a bottom of said vacuum chamber and arranged to vaporize a film forming material;

a control means disposed outside of said vacuum chamber for receiving data signals and electrically connected to said electron gun to send output control signals to control the power supply of the electron gun;

a crucible disposed adjacent to said electron gun for holding the film forming material;

a shutter disposed above said crucible for controlling the deposition of vaporized film forming material going from the bottom to the top of said vacuum chamber, and connected electrically to said control means for receiving opening/closing instruction signals from the control means;

a substrate thermometer disposed in the vicinity of said coating dome for measuring the temperature of the objects held by said coating dome, and connected electrically to said control means for sending data to said control means;

a vacuum gauge disposed inside of said vacuum chamber for measuring the degree of vacuum inside of said vacuum chamber, and connected electrically to said control means for sending data to said control means;

an evacuation unit disposed outside of said vacuum chamber for evacuating said vacuum chamber, and connected electrically to said control means to receive operating signals;

a halogen heater disposed inside of said vacuum chamber for heating the objects of film formation held by said coating dome, and connected electrically to said control means to receive on/off signals;

an optical film thickness meter disposed on the top of said vacuum chamber for measuring the thickness of a thin film deposited on the objects held by said coating dome, wherein the film thickness meter measures the thickness of the thin film by measuring a light quantity of transmission or reflection obtained when a prescribed light is applied to the objects on which the thin film is formed, wherein the light quantity depends on the thickness of the thin film;

a film thickness monitor connected to said optical film thickness meter for receiving signals from said optical film thickness meter, and connected electrically to said control means for outputting signals to said control means;

a standard light quantity value data storing means connected to said control means for storing standard light quantity value data and forwarding said standard light quantity value data to said control means; and an input means connected to said control means for outputting preset values to said control means.

8. The thin film forming apparatus of claim 7, wherein said coating dome has a circular shape so that evaporation can be performed on a plurality of subjects at the same time.

9. The thin film forming apparatus of claim 7, wherein said thin film forming apparatus has a monitoring glass plate located at the center of said coating dome.

10. The thin film forming apparatus of claim 7, wherein said crucible is cooled.

11. The thin film forming apparatus of claim 7, wherein the crucible is made of a substance having high thermal conductivity.

12. A thin film forming apparatus of claim 7, wherein said controller performs conversion operations of $Ri \equiv 1-(\Delta l_i/\Delta ls_i)$ and $Qi \equiv kRi|Ri|$, wherein k is an arbitrary constant, and controls power supplied to the electron gun by PID (proportion, integration, and differentiation) control so as to minimize $|Qi|$;

wherein $\Delta li \equiv li - l_{i-1}$;

wherein $\Delta ls_i \equiv ls' - ls$;

wherein li is an actual light quantity at a time point of ti;

wherein $l_{i-1}$ is an actual light quantity at a time point of $t_{i-1}$;

wherein ls is a standard light quantity at a time point of ts;

wherein ls' is a standard light quantity at a time point ts';

wherein ts' is defined as: $ts' = ts + \Delta t$, wherein $\Delta t = t_i - t_{i-1}$.

\* \* \* \* \*